United States Patent [19]

Dahm et al.

[11] 4,324,817
[45] Apr. 13, 1982

[54] PROCESS FOR MAKING CARBONLESS COPYING PAPER

[75] Inventors: Manfred Dahm, Leverkusen; Gert Jabs, Odenthal; Christian Wegner, Cologne, all of Fed. Rep. of Germany

[73] Assignee: Bayer Aktiengesellschaft, Leverkusen, Fed. Rep. of Germany

[21] Appl. No.: 171,306

[22] Filed: Jul. 23, 1980

[30] Foreign Application Priority Data

Jul. 26, 1979 [DE] Fed. Rep. of Germany ....... 2930408

[51] Int. Cl.³ .............................................. B41M 5/16
[52] U.S. Cl. .................................. 427/150; 252/316; 282/27.5; 427/151; 427/153; 428/320.8; 428/327; 428/537; 428/689; 428/425.1
[58] Field of Search ............... 282/27.5; 428/307, 411, 428/537, 913, 914, 320.8, 327, 423, 689; 252/316; 427/150–153, 180, 288

[56] References Cited

U.S. PATENT DOCUMENTS 3,900,669  8/1975  Kiritani ................ 428/307

FOREIGN PATENT DOCUMENTS 2251381  8/1975  Fed. Rep. of Germany ..... 282/27.5

*Primary Examiner*—Bruce H. Hess
*Attorney, Agent, or Firm*—Connolly and Hutz

[57] ABSTRACT

A "one-component" carbonless copying paper, comprising paper having on the same surface thereof (1) a color former encapsulated in walls of polyurea obtained by the reaction of a polyisocyanate with a polyamine and water, and (2) a developer capable of reacting with the color former to form a dyestuff, the developer having been formed in situ during the reaction of the polyisocyanate with the polyamine.

5 Claims, No Drawings

PROCESS FOR MAKING CARBONLESS COPYING PAPER

This invention relates to carbonless copying paper having one layer in which are contained colourless colour-forming agents in microcapsules of polyurea and also colour developer, the latter having been prepared in situ in the aqueous reaction mixture of polyisocyanate and polyamine.

Carbonless copying papers are known (see M. Gutcho, Capsule Technology and Microencapsulation, Noyes Data Corporation, 1972, pages 242–277; G. Baxter in Microencapsulation, Processes and Applications, published by J. E. Vandegaer, Plenum Press, New York, London, pages 127–143).

Carbonless copying paper preferably consists of two or more sheets of paper loosely placed one above the other, each upper sheet having a donor layer at the back and each lower sheet having a receptor layer at the front so that there is always a donor layer in contact with an acceptor layer. The donor layer contains microcapsules in which the core consists of a solution of a colour forming agent in an organic solvent while the acceptor layer contains a material which reacts with the colour-forming agent to produce the dyestuff.

When the paper is written upon, the capsules are "image-wise" destroyed by the high pressure of the writing implement and the core material escaping from the capsules is transferred to the acceptor layer so that a copy is produced. The acceptor layer generally contains binders and pigments, e.g. active absorbents such as kaolin, attapulgite, montmorrilonite, bentonite, acid Fuller's earth or phenol resins. Dyes which can be developed by acid, for example, can be used in the donor layer and acidic compounds are then used in the acceptor layer.

A different type of carbonless copying papers are the "one component" copying papers. These consist of a single sheet of paper carrying both the colour former, generally in the form of microcapsules, and the colour developer in one layer. When pressure is exerted on the paper, e.g. in a typewriter or by some other writing implement, the capsule containing the colour former is torn open and its contents reacts with the surrounding colour developer (see U.S. Pat. No. 2,730,456).

When the microcapsules used for preparing the "one component" carbonless copying paper have been obtained by complex coacervation of gelatine and gum arabic, the whole surface of the paper has a colour fog. Methods have been used to reduce this colour fog, for example by arranging a protective layer between the layer of capsules and the developer layer or by enclosing the capsules in a second covering.

According to German Auslegeschrift No. 2,251,381, "one component" carbonless copying papers contain the colour formers in microcapsules which have walls of polyurea (formed from polyisocyanates and polyamines). According to the teaching in this Auslegeschrift, polyureas obtained from polyisocyanate and water are not sufficiently leak-proof to prevent forming of a colour fog on the paper. Furthermore, the colour developers cannot be added to the dispersion of microcapsules until the polyaddition reaction of polyisocyanate and polyamine has been entirely completed.

The present invention provides "one component" carbonless copying paper consisting of paper having applied thereto on one surface:

(1) a colour former encapsulated in walls of a polyurea which has been obtained by the reaction of a polyisocyanate with a polyamine and water, and
(2) a developer which reacts with the colour former to form a dye,
  (1) and (2) being situated on one and the same surface, wherein the developer (2) has been formed in situ during the reaction of the polyisocyanate with the polyamine.

The developer is preferably formed by a change of temperature or pH resulting in the precipitation of organic polyanions in the reactive mixture of polyisocyanate and polyamine. A polysilicate or an aluminium hydroxide is preferably formed in situ by precipitation from silica sol or aluminium hydrate.

The mixture of microcapsules and developer obtained can be directly used for coating the paper after the addition of the usual binders and auxiliary agents and additives.

According to the invention, the developer is obtained in a finely divided form with a particularly active, large surface. It is in direct contact with the wall of the capsules. A substantially smaller quantity of microcapsules is therefore sufficient.

Suitable isocyanates for the preparation of the microcapsules include diisocyanates such as xylylene-1,4-diisocyanate, xylylene-1,3-diisocyanate, trimethylene diisocyanate, hexamethylenediisocyanate, propylene-1,2-diisocyanate, butylene-1,2-diisocyanate, ethylidene diisocyanate, cyclohexylidene-1,2-diisocyanate, cyclohexylidene-1,4-diisocyanate, and polydiisocyanate prepolymers such as, for example, the addition product of hexamethylene diisocyanate and hexane triol, the addition product of 2,4-tolylene diisocyanate and pyrocatechol, the addition product of tolylene diisocyanate and hexanetriol, the addition product of tolylene diisocyanate and trimethylolpropane and the addition product of xylylene diisocyanate and trimethylolpropane.

Suitable modified aliphatic isocyanates include those based on hexamethylene-1,6-diisocyanate, m-xylylenediisocyanate, 4,4'-diisocyanate-dicyclohexylmethane and isophoronediisocyanate, which contain at least two functional isocyanate groups per molecule.

Polyisocyanates based on derivatives of hexamethylene-1,6-diisocyanate with a biuret structure according to German Auslegeschriften Nos. 1,101,394 and 1,543,178 and German Offenlegungsschriften Nos. 1,568,017, 1,931,055 are also suitable.

The polyisocyanates may additionally be modified by a reaction with difunctional and trifunctional chain-lengthening agents such as water, polyhydric alcohols such as ethanediol, glycerol or trimethylolpropane, or carboxylic acids such as succinic acid, adipic acid or sebacic acid, used in proportions of from 0.01 to 0.5 mol per isocyanate equivalent.

Instead of or in addition to the isocyanate groups, the substances may also contain carbodiimide, uretdione, uretoneimine, uretdione diimine, 4-imino-oxazolidinone-(2), $\beta$-alkylene-propiolactone or cyclobutanedione-(1,3) groups as reactive groups.

Thus, for example, polyisocyanate-polyuretoneimines may be used. These may be obtained by the carbodiimisation of hexamethylene-1,6-diisocyanate containing biuret groups with the aid of organophosphorus catalysts, and further reaction of the initially formed carbodiimide groups with isocyanate groups to form uretoneimine groups.

These isocyanates may also be used as mixtures with each other and with other aliphatic and aromatic isocyanates.

The resulting modified polyisocyanate may contain considerable proportions of oxadiazinetrione, triisocyanurate or symmetrical triazine dione imine as structural elements, depending on the reaction conditions. These products are also suitable for forming the coverings of the capsules.

Diisocyanates corresponding to formula (I):

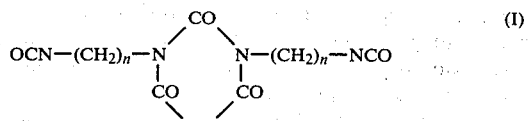

where $n = 3$ to 6, are particularly suitable.

Suitable diamines include aliphatic primary or secondary diamines, e.g. ethylene diamine-(1,2); bis-(3-aminopropyl)-amine; hydrazine; hydrazine ethanol-(2); bis-(2-methylaminoethyl)-methylamine; 1,4-diaminocyclohexane; 3-amino-1-methyl-aminopropane; N-hydroxyethyl-ethylene diamine; N-methyl-bis-(3-aminopropyl)-amine; 1,4-diamino-n-butane; 1,6-diamino-n-hexane; ethylene-(1,2)-diamine-N-ethyl-sulphonic acid (as alkali metal salt); 1-aminoethylethylenediamine-(1,2), and bis-(N,N'-aminoethyl)-ethylene diamine-(1,2). Hydrazine and its salts are also regarded as diamines in the present context.

Examples of colour formers include triphenylmethane compounds, diphenylmethane compounds, xanthene compounds, thiazine compounds and spiropyrane compounds.

The following in particular are suitable: triphenyl methane compounds: 3,3-bis-(p-dimethylaminophenyl)-6-dimethylaminophthalide ("Crystal Violet Lactone" hereinafter referred to as "C.V.L.") and 3,3-bis-(p-dimethylaminophenyl)-phthalide ("Malachite Green Lactone"); diphenylmethane compounds: 4,4'-bis-dimethylaminobenzhydryl benzyl ether, N-halogen-phenyl-leucolamine, N-β-naphthylleucolamine, N-2,4,5-trichlorophenylleutolamine and N-2,4-dichlorophenyl-leucolamine; xanthene compounds: rhodamine-β-anilinolactam, rhodamine-β-(p-nitroaniline)-lactam, rhodamine-β-(-p-chloroaniline)-lactam, 7-diethylamine-2-methoxyfluoran, 7-diethylamine-3-methoxyfluoran, 7-diethylamine-3-methylfluoran, 7-diethylamine-3-chlorofluoran, 7-diethylamine-3-chloro-2-methylfluoran, 7-diethylamine-2,4-dimethylfluoran, 7-diethylamine-2,3-dimethylfluoran, 7-diethylamine-(3-acetylmethylamine)-fluoran, 7-diethylamine-3-methylfluoran, 3,7-diethylamine-fluoran, 7-diethylamine-3-(dibenzylamine)-fluoran, 7-diethylamine-3-(methylbenzylamine)-fluoran, 7-diethylamine-3-(chloroethylmethylamino)-fluoran, 7-diethylamine-3-(dichloroethylamine)-fluoran, and 7-diethylamine-3-(diethylamine)-fluoran; thiazine compounds: N-benzoyl-leucomethylene blue, o-chlorobenzoyl-leucomethylene blue and p-nitrobenzoyl-leucomethylene blue; spiro compounds: 3-methyl-2,2'-spiro-bis-(benzo(f)-chromene).

Examples of solvents which dissolve these colour formers include chlorinated diphenyl, chlorinated paraffin, cotton seed oil, ground nut oil, silicone oil, tricresyl phosphate, monochlorobenzene, partially hydrogenated terphenyls, alkylated diphenyls, alkylated naphthalenes, aryl ethers, aryl alkyl ethers, higher alkylated benzene, etc.

Diluents such as kerosene, n-paraffins or isoparaffins are frequently added to the solvents.

To prepare the microcapsules, the colour formers and the isocyanate are first dissolved in the above mentioned solvents and the resulting organic phase is emulsified in the continuous aqueous phase which may contain protective colloid and possibly also emulsifiers. An aqueous polyamine solution is added to the emulsion in a quantity which is stoichiometric in relation to the polyisocyanate of the organic phase.

Protective colloids and emulsifying agents are added to the resulting emulsion for emulsification and stabilisation. Examples of such products acting as protective colloids include carboxymethylcellulose, gelatine and polyvinyl alcohol. Examples of emulsifiers include ethoxylated 3-benzyl-hydroxybiphenyl, reaction products of nonylphenol with varying quantities of ethylene oxide, and sorbitan fatty acid esters.

The microcapsules may be prepared continuously or batchwise, generally using dispersing apparatus which produce a high shearing gradient such as, for example, flat paddle mixers, rotor cage mixers, high-speed stirrers, colloid mills, homogenizers, ultrasonic dispersers, nozzles, steel nozzles, and supersonic machines. The vigorousness of the turbulence produced during mixing is the most important factor determining the diameter of the microcapsules obtained. Capsules measuring from 1 to 2000 μm may be prepared. Capsules having diameters from 2 to 20 μm are preferred. The capsules do not agglomerate and they have a narrow range of particle sizes. The ratio by weight of the material of the core to the material of the covering is in the range of from 50:90 to 50:10.

According to the process of this invention, aqueous solutions of substances which are converted during the reaction of the capsule wall into activated developers capable of undergoing a colour-forming reaction with the encapsulated dye precursors are added to the aqueous reaction mixture after the addition of the aqueous diamine solution.

The substances used according to the invention are preferably basic inorganic salts which are converted into insoluble polymer acids or oxides by a change in the pH of the reaction mixture.

Examples of such inorganic salts include zincates, stannates, cuprates, borates, tungstates, vanadates, molybdates, mixtures of phosphates with the above mentioned compounds, and, preferably, aluminates and silicates.

The activated form of developer substance can be made in the process of the invention by lowering the pH of the aqueous phase as formation of the capsule wall progresses, so that the polymeric acids or the hydroxides are precipitated from the basic salts in known manner. These polymer acids and the acid hydroxides, e.g. silicates or aluminium oxide, are known colour developers. To complete the reaction more rapidly and hence achieve a more rapid lowering of the pH, the reaction mixture may be heated to 60°–80° C. At this temperature, the water/isocyanate reaction gives rise to the evolution of carbon dioxide which accelerates the precipitation of the active developer substance.

It is therefore advantageous in the process according to the invention to use isocyanates with modifying structures capable of evolving $CO_2$ under the aforesaid reaction conditions. Isocyanates having an oxadiazinetrione structure are examples of such isocyanates.

Additional acids may be added to the aqueous phase towards the end of the capsule wall reaction in order to lower the pH below the neutral point and precipitate the active developer substances as completely as possible.

The progress of the polyaddition reaction giving rise to the formation of the capsule walls can be followed by observing the reaction of the isocyanate groups.

The suspension obtained at the end of the polyaddition reaction, consisting of microcapsules containing colour-producing substance and developer formed in situ, is spread coated on a supporting web, preferably of paper. Binders, spacers, substances accelerating the colour-forming reaction and other auxiliary agents and additives may be added to the suspension. Coating compositions of this type have long been known in the art (see M. Gutcho, Capsule Technology and Microencapsulation, Noyes Data Corporation, 1972, pages 242-277).

The homogenised suspensions of capsules and developer, containing binder and optionally inert fillers such as talcum or kaolin, may be applied manually to a support, using a spreader made of florist's wire, or mechanically for example using an air brush. The quantity applied to the support is generally from 4 to 8 g/m². Methods of coating paper have been described in German Offenlegungsschriften Nos. 1,934,457 and 1,955,542.

Acceptor components are also known in large numbers and have also been described in German Offenlegungsschriften Nos. 1,934,457 and 1,955,542.

The aqueous suspensions may be dried by conventional methods to produce free flowing powders. Many suitable drying processes for this purpose, such as freeze drying, spray drying, etc. are known and may be used for drying the suspension of capsules and developer according to the invention.

The free flowing powders of capsules and developer may also be taken up in organic solvents and used, for example, as a printing paste for printing large areas of paper.

The invention is illustrated by the following Examples, in which the percentages are by weight:

EXAMPLE 1

4.6 g of benzoyl leucomethylene blue and 13.9 g of crystal violet lactone are dissolved in 393.2 g of diisopropylnaphthalene with heating and stirring to form a clear solution, to which 98.3 g of isohexadecane and 90 g of oxadiazine trione diisocyanate are added. This organic phase is added to 1132.5 g of a 0.5% by weight aqueous solution of polyvinyl alcohol and emulsified by means of an ultrasonic whistle, the emulsion attaining a droplet size of about 10 $\mu$m. A 5.5% amine solution consisting of 9.7 g of diethylene triamine and 5.1 g of ethylene diamine in 252.7 g of salt-free water is added to this emulsion with stirring. After addition of the amine, 4 kg of a 30% aqueous silica sol (silica sol 30 of Bayer AG) are added to the suspension of capsules with stirring. The dispersion is then heated to 60° C. within 1.5 hours and maintained at 60° C. for a further 2 hours.

Formation of the capsule walls was completed during this after-treatment and the pH of the dispersion fell from 10.5 to 8.0 as a result of evolution of $CO_2$ and reaction.

After completion of the final reaction, 2 liters of water were added to the dispersion.

EXAMPLE 2

The procedure was the same as in Example 1, except that polyisocyanate used was the isocyanurate of hexamethylene diisocyanate. In this case, a stream of $CO_2$ was passed through the dispersion during the final reaction so that the pH of the slurry reached 7.0 after the after-treatment over 2 hours at 60° C.

EXAMPLE 3

The procedure was the same as in Example 1, except that 4 kg of a 20% silica sol containing 5% of sodium aluminate and 1% of sodium zincate were added to the suspension after addition of the amines.

EXAMPLE 4

The dispersions of encapsulated dye precursors and developer prepared in Examples 1 to 3 were spread coated on a paper support, using a wire spreader (30 $\mu$m), and a one-component reactive copying paper was thus produced. The weight of the coating was about 4 g/m² and the coated sheet of paper was pure white without any detectable blue fog.

To determine the writing power, 8 sheets of paper were placed on the one component reactive paper and placed in an electric typewriter (Olympia Standard) where letters "w" were typed as closely together as possible to cover an area of 4×4 cm, usng a constant typing pressure. The letters visible on the reactive paper were then examined for their intensity by measuring the loss of reflection compared with the reflection from a blank paper using a remission measuring apparatus (Elrephomat, Zeiss).

The following intensities of copying were measured:

| | Copying intensity $\left( \frac{I-I_o}{I} \cdot 100 \right)$ |
|---|---|
| Example 1 | 39.4 |
| Example 2 | 36.4 |
| Example 3 | 49.4 |

We claim:

1. A process for producing a "one-component" carbonless copying paper, which comprises forming microcapsules by reacting a polyisocyanate with a polyamine in an aqueous medium in the presence of (1) a color former whereby the color former becomes encapsulated in the resulting microcapsules and (2) a basic inorganic salt which becomes converted in situ during the microcapsule formation into an insoluble polymer acid or oxide developer capable of reacting with the color former to form a dyestuff, said basic inorganic salt being added to the aqueous reaction mixture after the addition of the polyamine; and coating the resulting mixture of encapsulated color former and developer onto a paper support.

2. The process according to claim 1 wherein the basic inorganic salt is converted to a polymer acid or metal salt developer by lowering the pH value of the reaction mixture.

3. The process according to claim 2 wherein reduction of the pH value is achieved by heating the reaction mixture.

4. The process according to claim 1 wherein the basic inorganic salt is selected from the group consisting of aluminates, silicates, zincates, stannates, cuprates, borates, tungstates, vanadates, molybdates, and mixtures thereof with phosphates.

5. The process according to claim 1 wherein said developer is selected from the group consisting of polysilicates, aluminum hydroxide formed by precipitation of silica sol, aluminum hydrate, and mixtures thereof.

* * * * *